US008076953B2

(12) United States Patent
Snelten

(10) Patent No.: US 8,076,953 B2
(45) Date of Patent: Dec. 13, 2011

(54) LED OUTAGE DETECTION CIRCUIT

(75) Inventor: Jeroen Snelten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 67 days.

(21) Appl. No.: 12/596,863

(22) PCT Filed: Apr. 23, 2008

(86) PCT No.: PCT/IB2008/051553

§ 371 (c)(1), (2), (4) Date: Oct. 21, 2009

(87) PCT Pub. No.: WO2008/132661

PCT Pub. Date: Nov. 6, 2008

(65) Prior Publication Data

US 2010/0117656 A1 May 13, 2010

(30) Foreign Application Priority Data

Apr. 27, 2007 (EP) .................................... 07107165

(51) Int. Cl.
*G01R 31/26* (2006.01)

(52) U.S. Cl. ................................................ 324/762.07

(58) Field of Classification Search ............. 324/705.15, 324/750.23, 757.04–757.05, 761.01–761.03, 324/762.07–762.1, 414; 327/514, 108–112, 327/66, 64; 315/291, 287, 129
See application file for complete search history.

(56) References Cited

U.S. PATENT DOCUMENTS

| | | | | |
|---|---|---|---|---|
| 3,987,424 | A * | 10/1976 | Brouwer et al. | 340/642 |
| 6,239,585 | B1 | 5/2001 | Buono | |
| 6,823,072 | B1 | 11/2004 | Hoover | |
| 6,873,111 | B2 | 3/2005 | Ito et al. | |
| 7,081,722 | B1 | 7/2006 | Huynh | |
| 7,129,856 | B2 | 10/2006 | Hering et al. | |
| 7,642,762 | B2 * | 1/2010 | Xie et al. | 323/282 |
| 2004/0080273 | A1 | 4/2004 | Ito et al. | |
| 2005/0200574 | A1 | 9/2005 | Goto et al. | |
| 2005/0231127 | A1 | 10/2005 | Yamamoto et al. | |
| 2005/0265039 | A1 | 12/2005 | Lodhie et al. | |
| 2007/0030033 | A1 | 2/2007 | Gerschfeld | |

FOREIGN PATENT DOCUMENTS

| | | |
|---|---|---|
| DE | 10358447 | 5/2005 |
| EP | 1043189 | 10/2000 |
| EP | 1777533 | 4/2007 |
| JP | 09207662 | 8/1997 |

* cited by examiner

*Primary Examiner* — Huy Q Phan
*Assistant Examiner* — Tung X. Nguyen
(74) *Attorney, Agent, or Firm* — Mark L. Beloborodov

(57) ABSTRACT

Disclosed is an outage detection circuit for detecting a defective light source, such as a LED coupled to a DC-DC converter circuit for receiving a power signal. The outage detection circuit includes a top voltage detector coupled to the LED for detecting a voltage across the LED. The top voltage detector has a top voltage terminal for supplying a top voltage signal. The detection circuit further includes a differential amplifier coupled to the top voltage terminal for receiving the top voltage signal as a first input signal and coupled to a reference voltage terminal. The reference voltage terminal is configured to supply a reference voltage as a second input signal. The differential amplifier includes an output terminal for supplying an outage detection signal.

5 Claims, 2 Drawing Sheets

LED OUTAGE DETECTION CIRCUIT

FIELD OF THE INVENTION

The present invention relates to an LED outage detection circuit for detecting a defective LED and outputting a corresponding detection signal.

BACKGROUND OF THE INVENTION

In e.g. automotive applications, it is desirable to have a warning system to indicate to a driver that a lamp of a lighting system, in particular tail lighting and/or break lighting, is defective. In response to the warning, the driver may replace the defective lamp.

A known prior art system requires a test mode or the like. For example, each time the lighting system is switched on or when a car is started, the lighting system is checked. However, if a lamp breaks during use, no signal is generated. Further, known prior art systems use complex and expensive circuitry in order to detect a defective lamp.

Moreover, a known prior art warning system is not suitable to be used with an LED. In particular, when an LED is dimmed, for example driven by a DC-DC converter circuit employing pulse width modulation (PWM) dimming, the known prior art system is not suitable to detect a defective LED.

OBJECT OF THE INVENTION

It is an object of the present invention to provide a simple, cost-effective LED outage detection circuit that is suitable to be used with an LED that may be dimmed.

SUMMARY OF THE INVENTION

The above object is achieved in an outage detection circuit according to claim 1.

The outage detection circuit according to the present invention comprises a top voltage detector. The top voltage detector is coupled to the LED for detecting a voltage across the LED. When a current flows through the LED, i.e. the LED is operated and not defective, a voltage across the LED has a predetermined value. If the LED is defective, the LED may be an open circuit, resulting in a voltage across the LED that is substantially equal to a supply voltage, which is usually substantially higher than the voltage across the LED when not defective. The top voltage detector detects the voltage across the LED, i.e. the relatively low operating voltage or the relatively high supply voltage.

It is noted that the top voltage detector determines a maximum voltage, i.e. a top voltage. Therefore, if the LED is dimmed using a PWM driving method, the detected voltage is substantially equal to the maximum supply voltage, substantially independent from a duty cycle of the supply voltage. Consequently, the top voltage detector may output a relatively low top voltage signal, if the LED is not defective, and a relatively high top voltage signal, if the LED is defective.

The top voltage signal output by the top voltage detector is supplied to a differential amplifier as a first input signal. The differential amplifier further receives a reference voltage as a second input signal. So, the differential amplifier is configured to output an outage detection signal based on a difference between the reference voltage and the top voltage signal. For example, if the top voltage signal is substantially equal to the relatively low operating voltage, the outage detection signal may have a low voltage; if the top voltage signal is substantially equal to the relatively high supply voltage, the outage detection signal may have a high voltage.

In an embodiment, the top voltage detector comprises a series connection of a diode and a capacitor and the top voltage terminal is provided at a node between the diode and the capacitor. In operation, the capacitor is charged up to the maximum voltage across the LED, while the diode prevents discharge of the capacitor in the periods in which the voltage across the LED is lower than the voltage across the capacitor. This is in particular suitable for use in combination with pulse width modulation (PWM) dimming.

In an embodiment, the differential amplifier comprises a differential pair of transistors, the first input signal being applied to a base of a first transistor and the second input signal being applied to the base of a second transistor, wherein the output terminal is coupled to a collector of the second transistor.

In an embodiment, the differential amplifier comprises an opamp device, the opamp device being configured to amplify a voltage difference between the first input signal and the second input signal and to output a voltage difference signal, the outage detection circuit further comprising a transistor, a base of the transistor being coupled to the opamp device for receiving the voltage difference signal, the output terminal of the differential amplifier being coupled to a collector of the transistor.

BRIEF DESCRIPTION OF THE DRAWINGS

Hereinafter, the present invention is elucidated with reference to the appended drawings showing non-limiting embodiments and wherein.

DETAILED DESCRIPTION OF EXAMPLES

Figure 1:
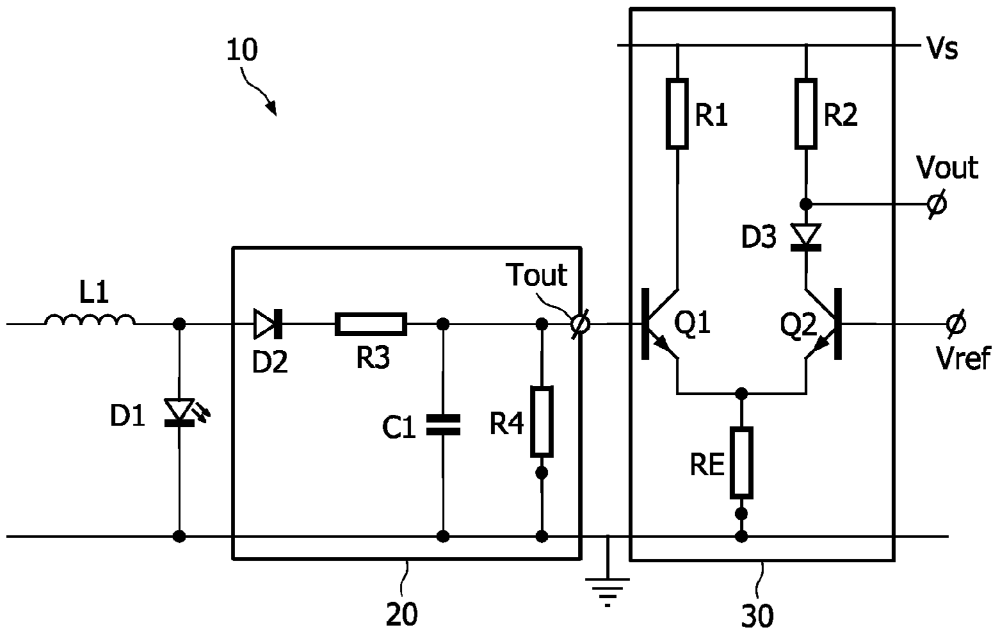
FIG. 1 shows a circuit diagram of a first embodiment of an outage detection circuit according to the present invention.

In the drawings, same reference numerals refer to same elements.

FIG. 1 shows a first embodiment of an outage detection circuit 10 in accordance with the present invention. The outage detection circuit 10 comprises a top voltage detector 20 and a differential amplifier 30. The top voltage detector 20 is coupled to a LED D1. The LED D1 is to be monitored and an outage detection signal should indicate the status of the LED D1. An inductor L1 is coupled across the LED D1. The inductor L1 is a part of a DC-DC converter for providing power to the LED D1. The inductor L1 is not essential. Any other DC-DC converter topology may be applied as well.

The top voltage detector 20 comprises a charge diode D2, a current limiting resistor R3, a capacitor C1 and a discharge resistor R4. The charge diode D2, the current limiting resistor R3 and the capacitor C1 are connected in series across the LED D1. The discharge resistor R4 is connected in parallel to the capacitor C1. The current limiting resistor R3 and the discharge resistor R4 also function as a voltage divider.

In operation, assuming the LED D1 is not defective, a current is provided through the inductor L1 and flows through the LED D1 to a common terminal. Thereby, an operating voltage is generated across the LED D1. This operating voltage may be, for example, 3.5 V. While the operating voltage is across the LED D1, the capacitor C1 is charged through the charge diode D2 and the current-limiting resistor R3 up to the operating voltage. The voltage across the capacitor C1 is applied as the top voltage signal at an output terminal Tout of the top voltage detector 20.

Now assuming that the LED D1 is defective and thus the LED D1 functions as an open circuit, a voltage substantially equal to a supply voltage supplied to the DC-DC converter is present across the open-circuit LED D1. Consequently, the capacitor C1 is charged up to said supply voltage, which may be assumed to be substantially higher than the LED operating voltage. The discharge resistor R4 removes any voltage pulses due to noise, for example.

The discharge resistor R4 has a relatively large resistance and may not be essential for correct operation. For example, the resistance of the discharge resistor R4 may be selected in relation to the operation, e.g. pulse width modulation operation. The discharge resistor R4 may be used to set a time constant of the parallel circuit of the discharge resistor R4 and capacitor C1 such that relatively fast voltage changes (e.g. noise), in particular voltage peaks above the reference voltage, are substantially ignored. Further, the discharge resistor R4 may be provided to allow discharge of the capacitor R4 in unexpected circumstances.

If the LED D1 is operated using a PWM current, the operating voltage is only during a first period of time present across the LED D1, while during a second period of time, no voltage (or a lower voltage) is generated across the LED D1. (The first and the second period of time are alternated.) During the first period of time, the capacitor C1 may be charged as above described. During the second period of time, the charge diode D2 prevents that the capacitor C1 is discharged through the LED D1. Thus, the top voltage detector 20 is suitable to be used in combination with PWM dimming.

The differential amplifier 30 comprises a pair of a first transistor Q1 and a second transistor Q2. A collector of each of the transistors Q1, Q2 is coupled to a supply voltage Vs through a first and a second resistor R1, R2, respectively. Between the second resistor R2 and the collector of the second transistor Q2, a third diode D3 is connected. The third diode D3 may prevent damage due to a voltage or current reversal. However, the third diode D3 may be omitted without influencing the correct operation of the outage detection circuit 10.

The emitter of the first and the second transistors Q1, Q2 are connected and a current sourcing resistor $R_E$ is connected between a common terminal and the emitters of the two transistors Q1, Q2. The current sourcing resistor $R_E$ may be replaced by any other suitable kind of current source without influencing the operation of the outage detection circuit.

The base of the first transistor Q1 is connected to the output terminal Tout of the top voltage detector 20. The base of the second transistor Q2 is connected to a reference voltage terminal. A reference voltage Vref is thus applied on the base of the second transistor Q2.

At a node between the collector of the second transistor Q2 and the second resistor R2, an output terminal Vout is configured for outputting an outage detection signal.

The reference voltage Vref may be suitably selected. For example, the reference voltage Vref may be substantially higher than the operating voltage. In such an embodiment, the second transistor Q2 will be conductive during correct operation of the LED D1, whereas the first transistor Q1 will be non-conductive due to a substantial lower base-emitter voltage of the first transistor Q1 compared to the second transistor Q2. As the second transistor Q2 is conductive, the voltage at the output terminal is relatively low, in particular substantially equal to the sum of the voltage across the current sourcing resistor $R_E$, the saturation voltage across the second transistor Q2 and the voltage across the third diode D3, which may amount to about 1 V, for example.

When the LED D1 is defective, the voltage at the base of the first transistor Q1 is substantially equal to a supply voltage of the DC-DC converter (this may be equal to the supply voltage Vs, but they do not need to be equal). With a suitably selected reference voltage Vref, the relatively high voltage at the base of the first transistor Q1, the first transistor Q1 is conductive, whereas the second transistor Q2 is not conductive. Hence, the current generated by the current sourcing resistor $R_E$ now flows through the first resistor R1 and the first transistor Q1, instead of through the second resistor R2 and the second transistor Q2 as described above. Consequently, the voltage at the output terminal Vout is substantially equal to the supply voltage Vs. Thus, when the LED D1 is defective, a substantially higher voltage is present at the output terminal Vout.

It is noted that the output terminal Vout may instead be connected between the first resistor R1 and the first transistor Q1. In such an embodiment, the outage detection signal would be high, when the LED D1 is not defective and low when the LED D1 would not be defective.

Figure 2:
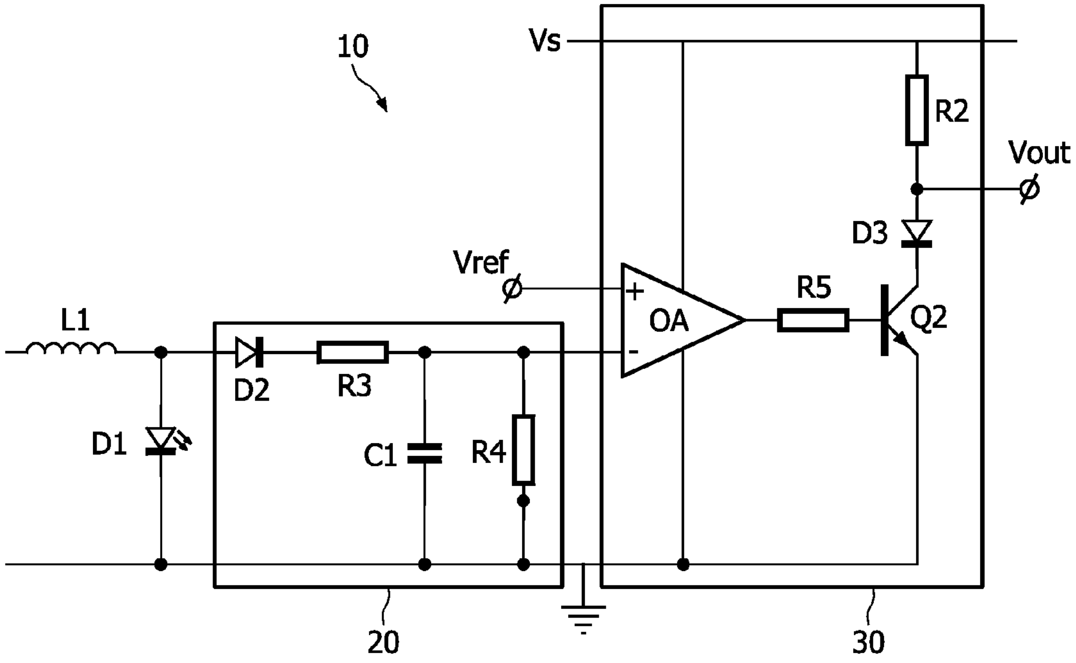
FIG. 2 shows a circuit diagram of a second embodiment of an outage detection circuit according to the present invention.

FIG. 2 shows a second embodiment which operates substantially similar to the first embodiment as shown in FIG. 1. Compared to the first embodiment, the first transistor is replaced by an opamp device OA. The opamp device OA functions as a differential amplifier. Thereto, the opamp device OA is connected to the top voltage detector output terminal Tout for receiving the top voltage signal and is connected to a reference voltage Vref. The opamp device OA compares the top voltage signal and the reference voltage Vref. The output of the opamp device OA is via a resistor R5 connected to the base of the second transistor Q2. If the output of the opamp device is high, the second transistor Q2 is conductive, resulting in a low voltage at the outage detection signal terminal Vout. If the output of the opamp device is low, the second transistor Q2 is not conductive, resulting in a high voltage (substantially equal to the supply voltage Vs) at the outage detection signal terminal Vout.

Suitably selecting the reference voltage Vref ensures that the reference voltage Vref is higher than the LED operating voltage, resulting in a high opamp device output and thus in a low outage detection signal at the output terminal Vout. Further, a suitably selected reference voltage Vref makes that the reference voltage Vref is equal to or lower than the supply voltage of the DC-DC converter, resulting in a low opamp device output and thus in a high outage detection signal at the output terminal Vout.

Figure 3:
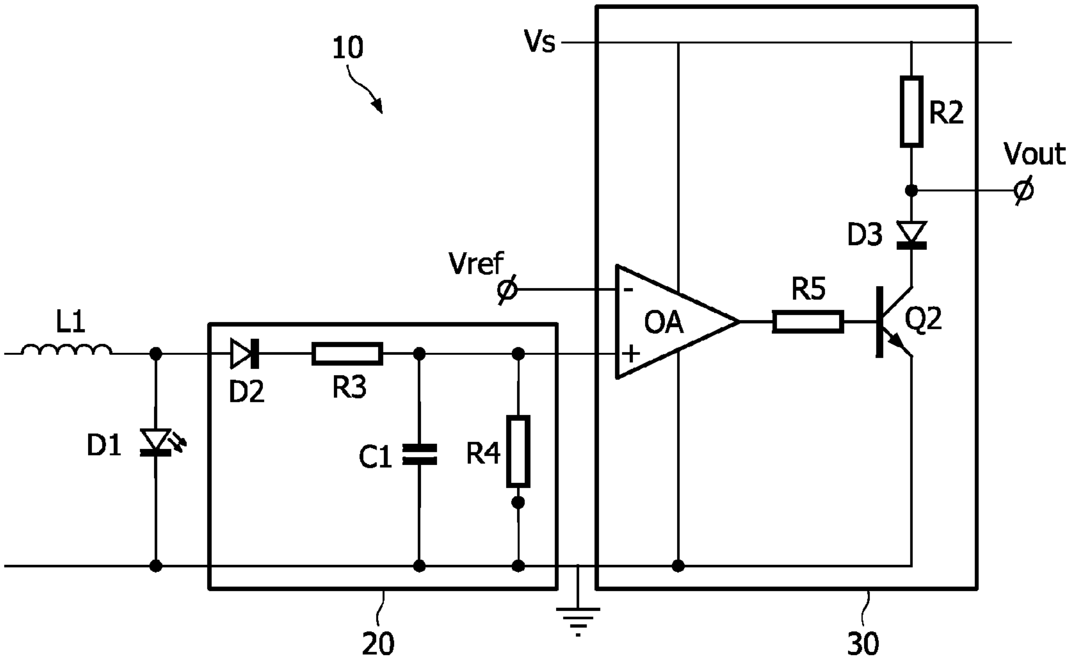
FIG. 3 shows a circuit diagram of a third embodiment of an outage detection circuit according to the present invention.

FIG. 3 shows substantially the same circuit as shown in FIG. 2. However, the circuit according to FIG. 3 is suitable for detecting a defective LED, which LED becomes a short circuit when defective. Thereto, the connections of the top voltage signal and the reference voltage with the opamp device OA, or similar comparative device, are interchanged and the reference voltage is selected to be lower than an expected LED operating voltage.

Figure 4:
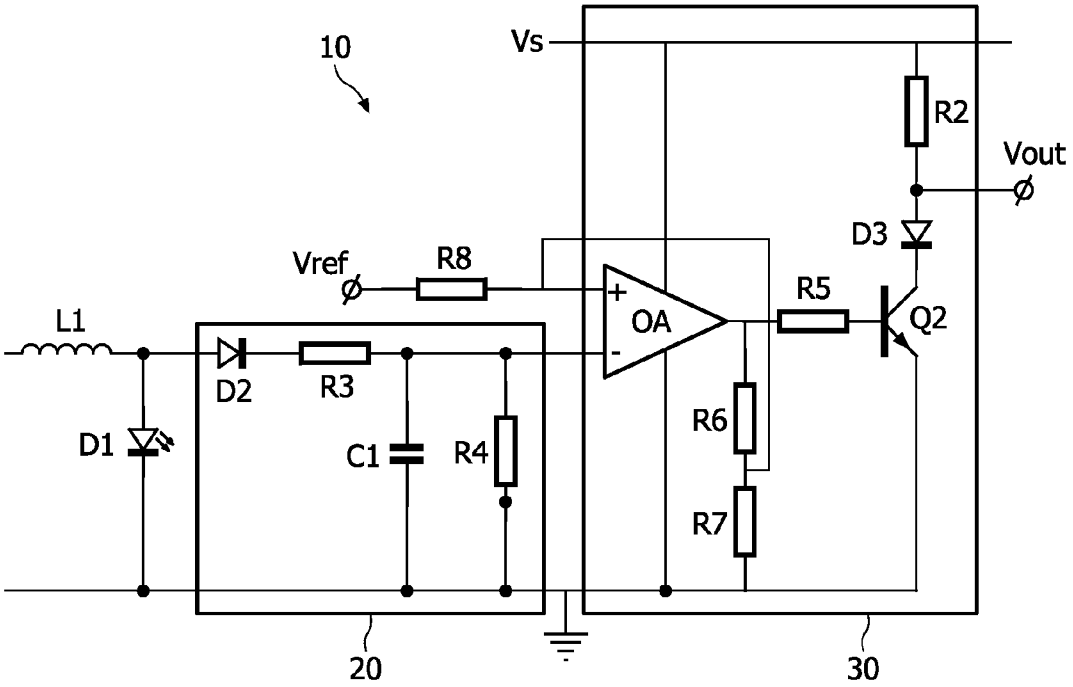
FIG. 4 shows a circuit diagram of a fourth embodiment of an outage detection circuit according to the present invention.

FIG. 4 shows substantially the same circuit as shown in FIG. 2, in which a hysteresis has been introduced. Thereto, a series connection of a first hysteresis resistor R6 and a second hysteresis resistor R7 has been connected between the output terminal of the opamp device OA and a third hysteresis resistor R8 has been introduced between the input terminal of the opamp device OA and the input terminal of the reference voltage Vref. Further, a connection between (1) a node between the third hysteresis resistor R8 and the opamp device OA and (2) a node between the first hysteresis resistor R6 and the second hysteresis resistor R7 is provided. Such a hysteresis circuit is well known in the art and a detailed discussion of its operation is therefore omitted here. Due to the hysteresis it is prevented that an outage detection signal alternates, if an LED would show instable operation (alternating between a defective state and an operative state, for example).

It is noted that the different circuit changes as present in FIGS. 3 and 4 in comparison to FIG. 2 may as well be introduced in the circuit arrangement as shown in FIG. 1. Further, it is noted that a circuit for detection of an open-circuit defective LED (as presented in FIGS. 1 and 2, for example) and a circuit for detection of a short-circuit defective LED (as presented in FIG. 3, for example) may be combined in order to enable to detect both kind of defective LEDs with one detection circuit. For example, the top voltage detection circuit 20 may be combined and the top voltage signal may be provided to two separate differential amplifier circuits. Further, the outage detection circuit according to the present invention is intended for use in combination with an LED. However, the outage detection circuit may also be suitable for use in combination with any other kind of lamp or device that becomes an open circuit or a short circuit when defective.

Although detailed embodiments of the present invention are disclosed herein, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Further, the terms and phrases used herein are not intended to be limiting; but rather, to provide an understandable description of the invention. The terms "a" or "an", as used herein, are defined as one or more than one. The term another, as used herein, is defined as at least a second or more. The terms including and/or having, as used herein, are defined as comprising (i.e., open language). The term coupled, as used herein, is defined as connected, although not necessarily directly, and not necessarily by means of wires.

The invention claimed is:

1. Outage detection circuit for detecting a defective LED, the LED being coupled to a DC-DC converter circuit for receiving a power signal, the outage detection circuit comprising:

a top voltage detector coupled to the LED for detecting a voltage across the LED, the top voltage detector having an top voltage terminal for supplying a top voltage signal; and a differential amplifier coupled to the top voltage terminal for receiving the top voltage signal as a first input signal and coupled to a reference voltage terminal, the reference voltage terminal being configured to supply a reference voltage as a second input signal, the differential amplifier comprising an output terminal for supplying an outage detection signal, wherein the top voltage detector comprises a series connection of a diode and a capacitor and wherein the top voltage terminal is provided at a node between the diode and the capacitor.

2. The outage detection circuit according to claim 1, wherein a resistor is coupled in parallel to the capacitor.

3. The outage detection circuit according to claim 1, wherein the differential amplifier comprises a differential pair of transistors, the first input signal being applied to a base of a first transistor and the second input signal being applied to the base of a second transistor, wherein the output terminal is coupled to a collector of the second transistor.

4. The outage detection circuit according to claim 1, wherein the differential amplifier comprises an opamp device, the opamp device being configured to amplify a voltage difference between the first input signal and the second input signal and to output a voltage difference signal.

5. The outage detection circuit according to claim 3, the outage detection circuit further comprising a transistor, a base of the transistor being coupled to the opamp device for receiving the voltage difference signal, the output terminal of the differential amplifier being coupled to a collector of the transistor.

* * * * *